United States Patent
Baldo et al.

(10) Patent No.: US 8,044,929 B2
(45) Date of Patent: Oct. 25, 2011

(54) ANALOG DATA-INPUT DEVICE PROVIDED WITH A PRESSURE SENSOR OF A MICROELECTROMECHANICAL TYPE

(75) Inventors: Lorenzo Baldo, Bareggio (IT); Chantal Combi, Oggiono (IT); Simone Sassolini, Vidigulfo (IT); Marco Del Sarto, Massa (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 1537 days.

(21) Appl. No.: 11/393,377

(22) Filed: Mar. 30, 2006

(65) Prior Publication Data

US 2006/0262088 A1 Nov. 23, 2006

(30) Foreign Application Priority Data

Mar. 31, 2005 (EP) ..................................... 05425183

(51) Int. Cl.
*G09G 5/00* (2006.01)

(52) U.S. Cl. ............ 345/156; 345/161; 73/715; 73/718; 73/721

(58) Field of Classification Search .................. 345/156, 345/161; 73/718, 715, 721
See application file for complete search history.

(56) References Cited

U.S. PATENT DOCUMENTS

| | | | |
|---|---|---|---|
| 4,276,533 A | | 6/1981 | Tominaga et al. |
| 4,445,383 A | * | 5/1984 | Binder et al. .................... 73/718 |
| 4,823,605 A | | 4/1989 | Stein |
| 5,090,247 A | | 2/1992 | Liebgen |
| 5,596,219 A | * | 1/1997 | Hierold .......................... 257/467 |
| 5,661,245 A | * | 8/1997 | Svoboda et al. .................. 73/726 |
| 5,830,372 A | * | 11/1998 | Hierold .............................. 216/2 |
| 5,844,287 A | * | 12/1998 | Hassan et al. .................. 257/419 |
| 6,115,030 A | * | 9/2000 | Berstis et al. .................. 345/161 |
| 6,195,082 B1 | * | 2/2001 | May et al. ...................... 345/161 |
| 6,472,244 B1 | | 10/2002 | Ferrari et al. |
| 6,504,253 B2 | | 1/2003 | Mastromatteo et al. |
| 6,546,799 B1 | * | 4/2003 | Vigna et al. ................. 73/514.01 |
| 6,627,965 B1 | * | 9/2003 | Tuller et al. .................... 257/415 |

(Continued)

FOREIGN PATENT DOCUMENTS

EP 1069419 A2 1/2001

(Continued)

OTHER PUBLICATIONS

Dow Corning Electronics Solutions, "Information About *Dow Corning®* Brand Dielectric Gels," *Product Information*, © 2002, 2003, 2004.

(Continued)

*Primary Examiner* — Alexander Eisen
*Assistant Examiner* — Viet Pham
(74) *Attorney, Agent, or Firm* — Lisa K. Jorgenson; Harold H. Bennett, II; Seed IP Law Group PLLC

(57) ABSTRACT

In a data-input device an actuator element that can be manually actuated, and a sensor mechanically coupled to the actuator element. The sensor is formed in a body of semiconductor material housing a first sensitive element, which detects the actuation of the actuator element and generates electrical control signals. The first sensitive element is a microelectromechanical pressure sensor, formed by: a cavity made within the body; a diaphragm made in a surface portion of the body and suspended above the cavity; and piezoresistive transducer elements integrated in peripheral surface portions of the diaphragm in order to detect its deformations upon actuation of the actuator element.

26 Claims, 3 Drawing Sheets

U.S. PATENT DOCUMENTS

| | | | |
|---|---|---|---|
| 6,640,642 B1 * | 11/2003 | Onose et al. ............... 73/718 |
| 6,838,362 B2 | 1/2005 | Mastromatteo et al. |
| 6,945,115 B1 * | 9/2005 | Wang ............... 73/718 |
| 7,352,356 B2 * | 4/2008 | Roberts et al. ............ 345/156 |
| 7,474,296 B2 * | 1/2009 | Obermeyer et al. ........ 345/156 |
| 2002/0006682 A1 | 1/2002 | Benzel et al. |
| 2002/0137348 A1 * | 9/2002 | Mlcak ............... 438/695 |
| 2002/0143484 A1 * | 10/2002 | Chiesa ............... 702/94 |
| 2003/0119220 A1 * | 6/2003 | Mlcak et al. ............ 438/52 |
| 2003/0168711 A1 | 9/2003 | Villa et al. |
| 2003/0205090 A1 * | 11/2003 | Jakobsen ............... 73/718 |
| 2004/0007750 A1 * | 1/2004 | Anderson et al. ............ 257/414 |
| 2004/0079159 A1 | 4/2004 | Muchow |
| 2004/0103724 A1 | 6/2004 | Takizawa et al. |
| 2004/0112138 A1 | 6/2004 | Knirck et al. |
| 2004/0224482 A1 * | 11/2004 | Kub et al. ............ 438/458 |
| 2004/0237658 A1 * | 12/2004 | Ohms et al. ............ 73/718 |
| 2004/0237661 A1 * | 12/2004 | Yang ............... 73/754 |
| 2004/0238821 A1 * | 12/2004 | Yang ............... 257/72 |
| 2004/0251906 A1 * | 12/2004 | Staple et al. ............ 324/415 |
| 2005/0000292 A1 * | 1/2005 | Muchow et al. ............ 73/715 |
| 2005/0132815 A1 | 6/2005 | Claude et al. |
| 2005/0199971 A1 * | 9/2005 | Anderson et al. ............ 257/414 |
| 2005/0208696 A1 * | 9/2005 | Villa et al. ............ 438/53 |
| 2005/0219220 A1 * | 10/2005 | Kishi et al. ............ 345/169 |
| 2005/0252301 A1 | 11/2005 | Dietrich |
| 2006/0082463 A1 * | 4/2006 | Sri-Jayantha et al. ........ 340/635 |
| 2008/0013102 A1 * | 1/2008 | Berger et al. ............ 356/600 |

FOREIGN PATENT DOCUMENTS

| | | |
|---|---|---|
| EP | 1324382 A1 | 7/2003 |
| EP | 1378736 A1 | 1/2004 |
| JP | 62059825 A * | 3/1987 |
| JP | 2001-174350 | 6/2001 |
| WO | WO 98/25115 | 6/1998 |
| WO | 0068930 A1 | 11/2000 |

OTHER PUBLICATIONS

Sugiyama, S., et al., "A 32 ×32 (1K)-Element Silicon Pressure-Sensor Array with CMOS Processing Circuits," *Electronics and Communications in Japan*, 75(1):64-75, Jan. 1992.

Lal, R., et al., "MEMS: Technology, Design, CAD and Applications", IEEE Computer Society, Proceedings of the 15th International Conference on VLSI Design (VLSID'02), Jan. 7, 2002, 2 pages.

Office Action dated Jun. 14, 2011, relating to the European Patent Application corresponding to U.S. Appl. No. 11/393,377, 4 pages.

* cited by examiner

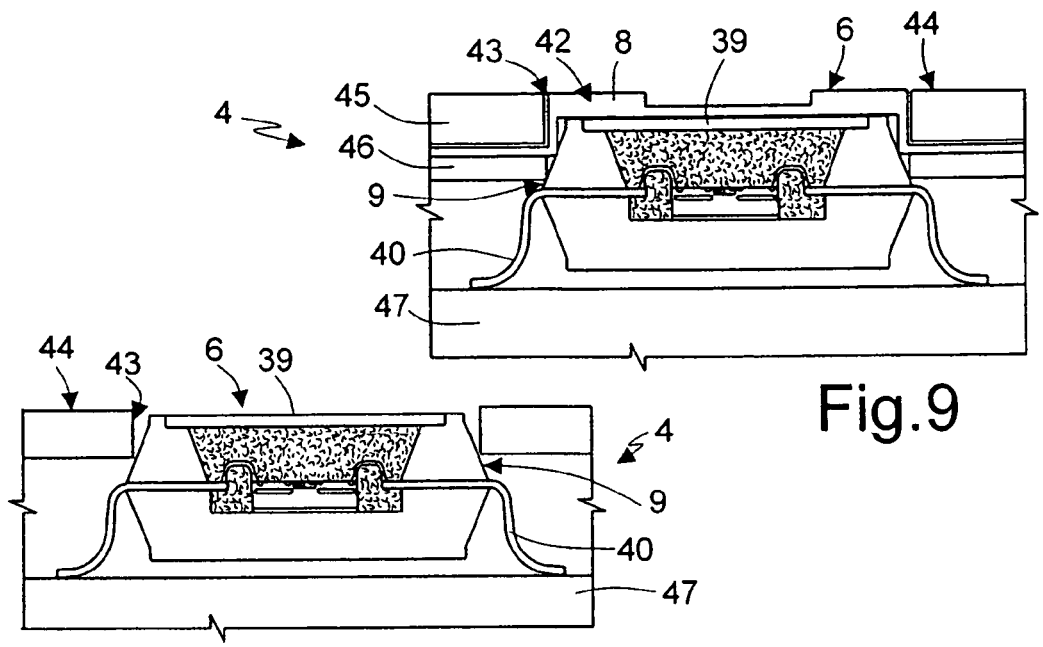
Fig.9
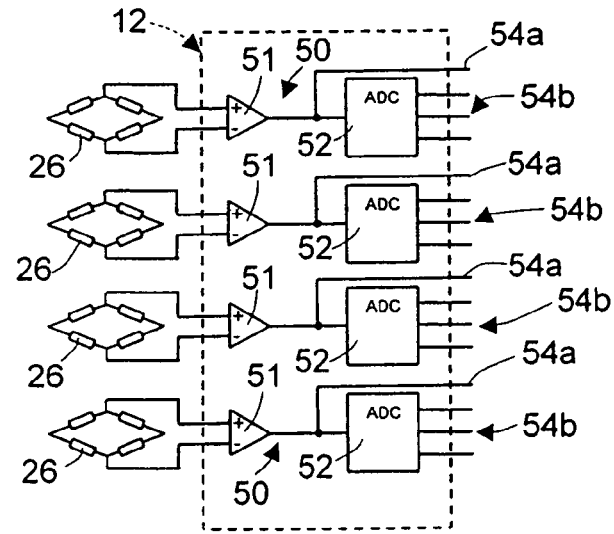
Fig.10
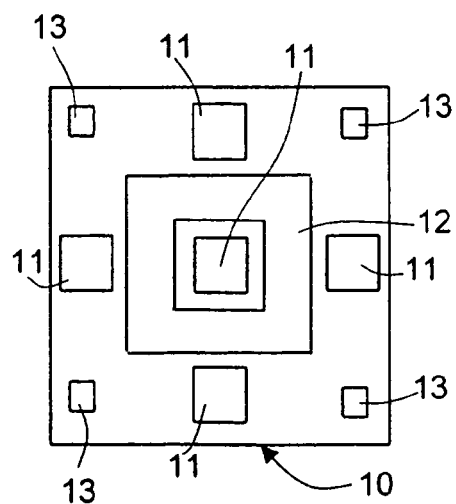
Fig.11
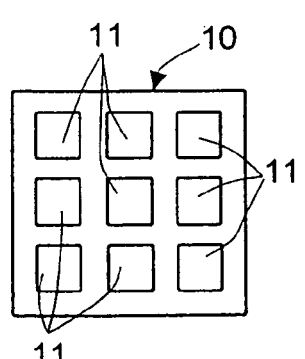
Fig.12
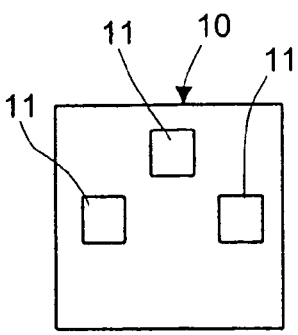
Fig.13
Fig.14

ANALOG DATA-INPUT DEVICE PROVIDED WITH A PRESSURE SENSOR OF A MICROELECTROMECHANICAL TYPE

BACKGROUND OF THE INVENTION

1. Field of the Invention

The present invention relates to an analog data-input device provided with a pressure sensor of a microelectromechanical type, in particular for use in a portable apparatus, such as a mobile phone, to which the ensuing description will make explicit reference, without this implying any loss of generality.

2. Description of the Related Art

As is known, latest-generation mobile phones offer a plurality of advanced functions, such as e-mail and internet managing, displaying of electronic documents, acquiring and displaying of images, in addition to "standard" functions, such as managing of telephone books, phone calls and text messages. Graphic user interfaces (GUIs) enable simple and effective management of the various functions, via data-input devices (generally called Trackpoints®) integrated in the mobile phones. The data-input devices enable scrolling of lists, making of selections, moving of a cursor displayed on the screen, or in general generation of actions within the graphic interface.

Data-input devices generally comprise an actuator element that can be actuated by a user, and a sensor mechanically coupled to the actuator element to detect its actuation and generate corresponding electrical signals. Such electrical signals, possibly amplified and filtered, are acquired by an electronic control circuit of the mobile phone, which thus generates the corresponding action within the graphic interface (for example, cursor displacement, or scrolling of a list).

In detail, the actuator element comprises one or more push-buttons, for example four arranged to form a cross. A direction of displacement within the graphic interface (for example, "Up", "Down", "Right", "Left") corresponds to each one of the push-buttons. Alternatively, instead of the push-buttons, the actuator element can comprise a single pin-shaped element (joystick), which is mobile in a number of directions.

The sensor comprises one or more sensitive elements, which can be of a digital type, or of an analog type. The sensitive elements of a digital type are switches, which are mechanically coupled to the actuator elements and close upon their actuation (for example, upon the pressure of a corresponding push-button, or else upon the displacement of the joystick in the corresponding direction). The sensitive elements of an analog type are piezoelectric or piezoresistive and comprise a mechanical element and an interface electronic circuit external to the mechanical element. The mechanical element undergoes a deformation following upon actuation of the actuator elements and generates an electrical quantity corresponding to the undergone deformation (a variation of electrical charge or of a resistivity). The interface electronic circuit generally comprises charge-amplifier circuits (in the case of piezoelectric sensitive elements), or bridge circuits (in the case of piezoresistive sensitive elements), and generates an electrical signal proportional to the deformation undergone by the mechanical element, which is acquired by the control circuit of the mobile phone.

If the data-input devices comprise sensitive elements of a digital type, the only information available to the control circuit of the mobile phone is the binary closing or opening state of the switches. Consequently, it is not possible to have a flexible control of the corresponding actions within the graphic interface; for example, it is possible to generate a displacement of a cursor in one or more directions, but it is not possible to regulate its speed of displacement. For this reason, operations such as the scrolling of a phone book, or else the zoom of an image are particularly laborious and far from immediate in so far as they require prolonged pressure on one and the same push-button, or else the displacement of the joystick in the same direction for a long time interval.

Instead, if the data-input devices comprise sensitive elements of an analog type, the control circuit of the mobile phone receives not only the information regarding the detection of an actuation of an actuator element, but also the information regarding the intensity of said actuation. Consequently, the control circuit provides a more flexible control of the actions generated within the graphic interface. For example, not only does it impart on the cursor a displacement in one or more directions, but also regulates its speed of displacement on the basis of the force with which the actuator elements have been actuated (and hence the amount of the corresponding deformation of the sensitive elements).

Known data-input devices comprising sensitive elements of an analog type have, however, the disadvantage of entailing a greater occupation of area and a greater complexity of implementation, both due to the presence of the mechanical element and the interface electronic circuit external to the mechanical element, and to the need for providing the corresponding electrical connections. Consequently, said devices are not particularly suited to integration in portable apparatuses, such as mobile phones.

BRIEF SUMMARY OF THE INVENTION

According to an embodiment of the present invention, a data-input device is provided, comprising an actuator element that can be manually actuated, and a sensor mechanically coupled to the actuator element and including a body made of semiconductor material, the body housing a sensitive element configured to detect an actuation of the actuator element and to generate electrical control signals, the sensitive element including a microelectromechanical pressure sensor.

BRIEF DESCRIPTION OF THE SEVERAL VIEWS OF THE DRAWING(S)

For a better understanding of the present invention, there are now described preferred embodiments thereof, purely by way of non-limiting example and with reference to the attached drawings, wherein:

FIG. 9 shows a cross section of the data-input device of FIG. 1, according to one embodiment of the present invention;

FIG. 10 shows the circuit diagram of an interface electronic circuit belonging to the pressure sensor of FIG. 2;

FIG. 11 shows a cross section of the data-input device of FIG. 1 according to a different embodiment of the present invention; and FIGS. 12-14 show schematic top views of further embodiments of the pressure sensor die.

DETAILED DESCRIPTION OF THE INVENTION

Figure 1:
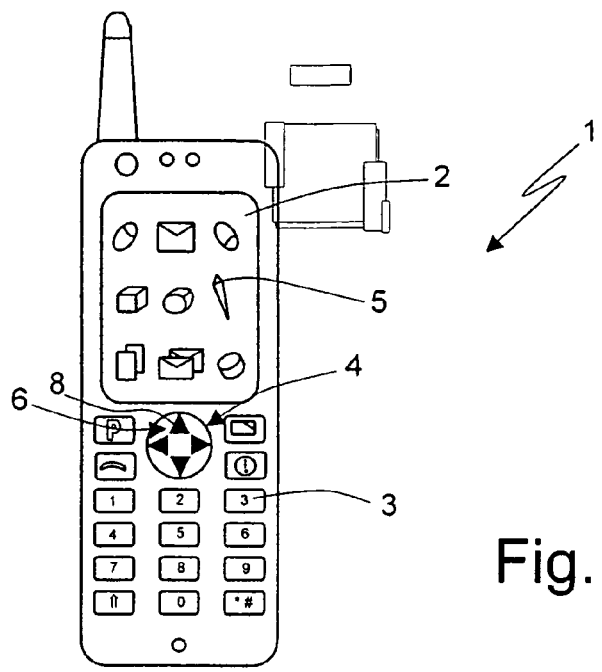
FIG. 1 shows a portable apparatus, in particular a mobile phone, comprising a data-input device.

As shown in FIG. 1, a portable apparatus, in particular a mobile phone, designated as a whole by 1, comprises a display 2, a plurality of function keys 3, and a data-input device 4. In a per se known manner, the function keys 3 enable execution of standard functions of the mobile phone 1, such as for example dialing of telephone numbers or composition of text messages, and on the display 2 a graphic interface 5 is displayed, made up of a plurality of icons, to each of which corresponds a given function (or set of functions) of the mobile phone 1. The data-input device 4 is, for example, located in a central portion of the body of the mobile phone 1, underneath the display 2, and enables a user to interact with the graphic interface 5. In particular, the data-input device 4 enables generation of displacement actions within the graphic interface 5 and selection and activation of particular functions of the mobile phone 1; moreover, the data-input device 4 controls movement of a cursor (not illustrated) in the display 2 in given operating conditions of the mobile phone 1.

The data-input device 4 comprises an actuator element 6, which is manually actuated by the user, and a pressure sensor 9 (see also FIGS. 2, 8 and 9), which is mechanically coupled to the actuator element 6 and detects its actuation, generating corresponding electrical signals. In particular, the pressure sensor 9 is located underneath the actuator element 6 so as to undergo mechanical deformations upon the actuation of the actuator element 6. In the example of FIG. 1, the actuator element 6 comprises four push-buttons 8 arranged to form a cross, and corresponding to the four directions "Up", "Down", "Right", "Left" of generation of displacements within the graphic interface 5.

Figure 2:
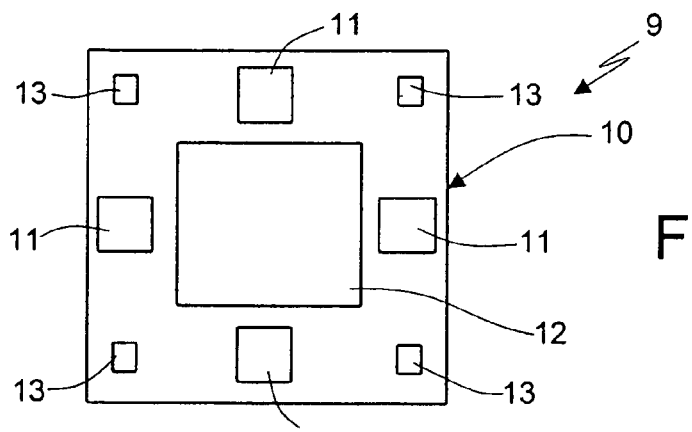
FIG. 2 shows a schematic top view of a die of semiconductor material of a pressure sensor belonging to the data-input device of FIG. 1, made according to a first embodiment of the present invention.

According to an embodiment of the present invention, illustrated schematically in FIG. 2, the pressure sensor 9 comprises a die 10 of semiconductor material, in particular silicon, housing four sensitive elements 11, in particular of a microelectromechanical type, and an interface electronic circuit 12 connected to the sensitive elements 11. Connection pads 13 are provided on a surface of the die 10 for electrical connection of the sensitive elements 11 with an electronic control circuit (not shown) of the mobile phone 1. The sensitive elements 11 are arranged in a way corresponding to the push-buttons 8 of the actuator element 6, and thus, in the example, are arranged to form a cross. In addition, each sensitive element 11 detects, in a preferential way, the actuation of a corresponding push-button 8, in the sense that it supplies a maximum output when the corresponding push-button 8 is actuated. The interface electronic circuit 12 is formed in a region of the die 10 not occupied by sensitive elements 11; in the example, it is formed in a central position with respect to the sensitive elements 11 (but it is evident that other locations can be envisaged).

The process for manufacturing the die 10 is based upon the process described in the patent application EP-A-1 324 382, for manufacturing a SOI wafer, and the process described in U.S. application Ser. No. 11/082,491, filed Mar. 16, 2005, for manufacturing a pressure sensor.

Figure 3:
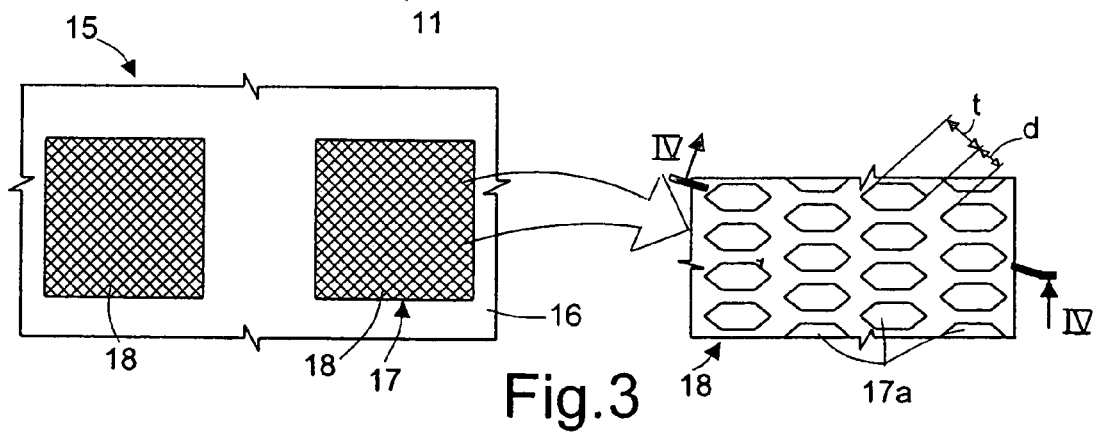
FIG. 3 shows a top view of a wafer of semiconductor material in an initial step of a process for manufacturing the die of FIG. 2.
Figure 4:
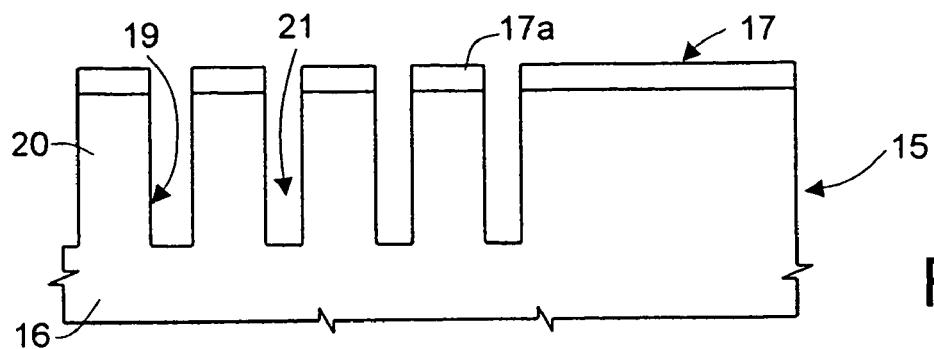
FIG. 4 shows a cross section at an enlarged scale of details of FIG. 3.

In detail, FIG. 3, in an initial step of the manufacturing process, a resist mask 17 is made on top of a wafer 15 of semiconductor material, comprising a substrate 16 of an N type silicon, for example (see also the cross section of FIG. 4). The mask 17 has areas 18 having an approximately square shape, each comprising a plurality of hexagonal mask portions 17a that define a honeycomb lattice (as may be seen in the enlarged detail of FIG. 3). For example, the distance t between opposite sides of the mask portions 17a is equal to 2 μm, whilst the distance d between facing sides of adjacent mask portions 17a is equal to 1 μm. In particular, the number of areas 18 of the mask 17 corresponds to the desired number of sensitive elements 11, and their arrangement on the surface of the wafer 15 corresponds to the desired arrangement of the sensitive elements 11 (in FIG. 3 just two areas 18 are illustrated, for example corresponding to the sensitive elements 11 related to the "Right" and "Left" displacement directions within the graphic interface 5).

Then (FIG. 4), using the mask 17, an anisotropic chemical etch of the substrate 16 is performed, as a result of which trenches 19 are formed, having, for example, a depth of 10 μm, which are intercommunicating and delimit a plurality of silicon columns 20. In practice, the trenches 19 form an open region 21 of complex shape (corresponding to the honeycomb lattice of the mask 17), wherein the columns 20 (having a shape corresponding to the mask portions 17a) extend.

Figure 5:
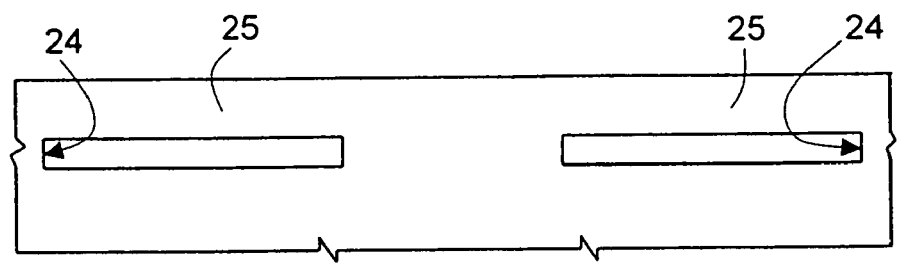
FIGS. 5-7 show cross sections through the wafer of FIG. 3 in subsequent steps of the manufacturing process.

Next, the mask 17 is removed, and an epitaxial growth is performed in a deoxidizing environment (typically, in an atmosphere with a high concentration of hydrogen, preferably with trichlorosilane-SiHCl$_3$). Consequently, an epitaxial layer, for example of an N type and of thickness equal to 9 μm, grows above the columns 20 and closes the open region 21 at the top. Then a step of thermal annealing is performed, for example for 30 minutes at 1190° C., preferably in an atmosphere of hydrogen, or, alternatively, of nitrogen. As discussed in the aforementioned patent applications, the annealing step causes a migration of the silicon atoms, which tend to move into the position of lower energy. Consequently, and also thanks to the close distance between the columns 20, the silicon atoms migrate completely from the portions of the columns 20 within the open region 21, and a buried cavity 24 is formed (FIG. 5), having a side for example equal to 500 μm. Above the buried cavity 24 a thin layer of silicon remains, which is constituted in part by epitaxially grown silicon atoms and in part by migrated silicon atoms, and forms a diaphragm 25. The diaphragm 25 is flexible and can deflect in the presence of external stresses. At the end of this step, as many diaphragms 25 are formed as are the areas 18 of the mask 17, which were previously defined (once again, just two are shown in FIG. 5).

Figure 6:
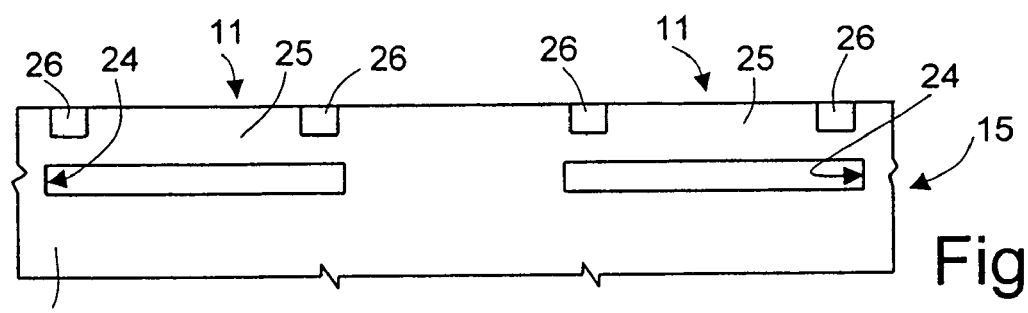

Next (FIG. 6), piezoresistive elements 26 are formed in a surface portion of the diaphragm 25 opposite to the buried cavity 24, in particular at central peripheral portions of the diaphragm 25. In detail, the piezoresistive elements 26 are formed by P-type diffusion or implantation, for example of boron atoms, and are connected to one another in a Wheatstone-bridge configuration (in a way not illustrated in FIG. 6). At the end of this step, the sensitive elements 11, each of which comprises a diaphragm 25 suspended above a buried cavity 24, and corresponding piezoresistive elements 26 have been formed.

Figure 7:
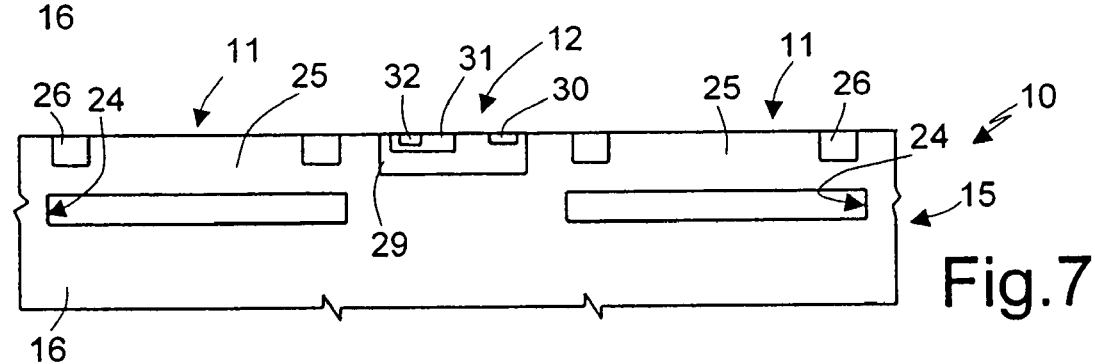

As illustrated in FIG. 7, the interface electronic circuit 12 is formed in the region of the wafer 15 comprised between two aligned sensitive elements 11. In particular, the interface electronic circuit 12 (by way of example, in FIG. 7 just one bipolar transistor comprising a well region 29, a collector region 30, a base region 31, and an emitter region 32 is shown) is formed using manufacturing steps which are in common with those of the manufacturing process of the sensitive elements 11. Electrical insulation regions (not illustrated) can be provided for electrically insulating the interface electronic circuit 12 from the sensitive elements 11.

In a final step of the manufacturing process, the wafer 15 is then cut so as to obtain the die 10. In addition, the connection pads 13 are formed, for example via metallic deposition, and the corresponding connections with the interface electronic circuit 12 are formed.

Figure 8:
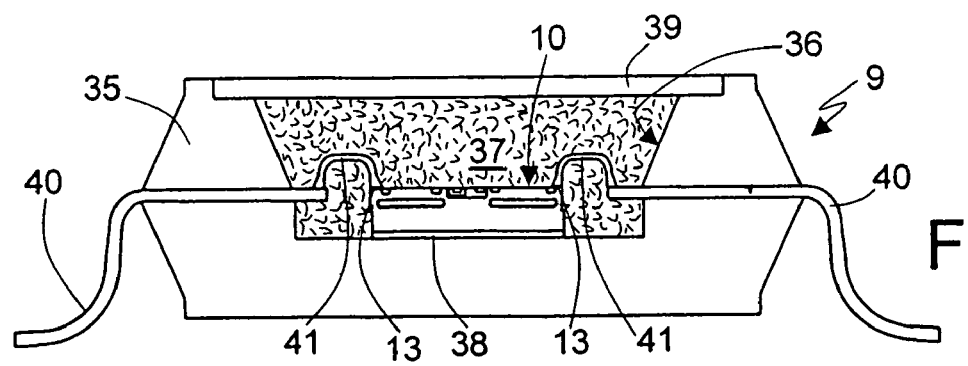
FIG. 8 shows a cross section of the pressure sensor of FIG. 2, with the die included in a package.

As illustrated in FIG. 8, the pressure sensor 9 further comprises a package 35, made for example of ceramic material, which includes the die 10. In particular, the die 10 is arranged in an open chamber 36 of the package 35; in particular, it is bonded to a bottom internal surface of the chamber 36 via a layer of adhesive material 38. The chamber 36 is filled with a coating gel 37, made up of an elastomer, for example a silicone elastomer, having a low Young's modulus, and is closed at the top by a membrane 39 made of flexible plastic material, which delimits a main top surface of the package 35. The coating gel 37 can, for example, be a silicone gel produced by the Company Dow Corning®.

The electrical connection between the connection pads 13 and the outside of the package 35 is made via metal leads 40, which are connected to the connection pads 13, inside the package 35, by means of wires 41.

The membrane 39, together with the coating gel 37, is an interface between the actuator element 6 (and in particular the push-buttons 8) and the sensitive elements 11, and enables transfer of the pressure deriving from the actuation of the actuator element 6 to the diaphragms 25 of the sensitive elements 11. In particular, the coating gel 37 protects the sensitive elements 11 from the external environment and from the direct pressure exerted by the user, which could cause damage thereto.

FIG. 9 shows in more detail a possible embodiment of the data-input device 4. In particular, the actuator element 6 comprises a flexible structure 42, shaped to form keys so as to provide the push-buttons 8, arranged in contact with the membrane 39 of the pressure sensor 9 at a window 43 made in a casing 44 of the mobile phone 1. In particular, the flexible structure 42 is squeezed between an external portion 45 and an internal portion 46 of the casing 44, and the pressure sensor 9 is fixed to a printed circuit 47 of the mobile phone 1 via the metal leads 40.

FIG. 10 shows in detail a possible embodiment of the interface electronic circuit 12.

The interface electronic circuit 12 comprises a number of circuit branches 50 equal to the number of sensitive elements 11 (each element 11 represented here by a Wheatstone bridge formed by the corresponding piezoresistive elements 26 of the respective element 11). Each circuit branch 50 comprises an amplifier stage 51, comprising an instrumentation amplifier, which receives an unbalancing signal produced by the Wheatstone bridge of the respective sensitive element 11, and an analog-to-digital converter stage (ADC) 52 connected to the output of the instrumentation-amplifier stage 51, which receives the amplified signal and converts it into a digital signal. The interface electronic circuit 12 has a first output 54a of an analog type, constituted by the output of the amplifier stage 51, and a second output 54b of a digital type, constituted by the output of the analog-to-digital converter stage 52, in particular an eight-level digital signal (3 bits). Both of the outputs 54a, 54b are connected to the connection pads 13 and thereby to the control circuit of the mobile phone 1.

Operation of the data-input device 4 is the following.

Upon actuation of one of the push-buttons 8 of the actuator element 6 (i.e., upon exerting a pressure thereon), a pressure is applied to the membrane 39 of the pressure sensor 9, which is transferred, via the coating gel 37, in a preferential way, to the diaphragm 25 of the corresponding sensitive element 11 (i.e., the one arranged in a position corresponding to the push-button 8 that has been actuated). Consequently, the diaphragm 25 undergoes a deformation, causing a variation in the resistivity of the piezoresistive elements 26 and so an unbalancing of the Wheatstone bridge, which is detected by the interface electronic circuit 12, which generates corresponding output signals. Actually, also the diaphragms 25 of adjacent sensitive elements 11 undergo a certain deformation (in particular if the sensitive elements 11 are close to each another), which is in any case of a smaller amount with respect to the deformation of the diaphragm 25 of the sensitive element 11 corresponding to the actuated push-button 8. The electronic control circuit of the mobile phone 1 then receives the output signals from the interface electronic circuit 12 and determines the action to be generated within the graphic interface 5 according to the relation between the various signals received (in particular, it generates a displacement in the direction corresponding to the sensitive element 11 that has undergone the greatest deformation). Furthermore, the speed of said displacement is a function of the value of the actuation pressure of the actuator element 6. In fact, the greater the actuation pressure, the greater the deformations of the diaphragm 25 of the corresponding sensitive element 11, the unbalancing of the Wheatstone bridge, and consequently the output signals sent to the electronic control circuit of the mobile phone 1.

The advantages of the data-input device according to the present invention are clear from the foregoing description.

It is, in any case, emphasized that the integration in a single die 10 of the sensitive elements 11 and of the corresponding interface electronic circuit 12 enables a reduced area occupation and a simpler assembly, in so far as it is no longer necessary to envisage a purposely provided wiring between the sensitive elements and an external interface electronics.

In addition, the sensitive elements 11 detect the intensity of the pressure acting on the push-buttons 8 so that the control circuit of the mobile phone not only determines the corresponding action or function to be generated within the graphic interface, but, for example, also the speed thereof. This makes the use of the graphic interface of the mobile phone much more flexible and practical for the user.

Finally, it is clear that modifications and variations may be made to the data-input device described and illustrated herein, without thereby departing from the scope of the present invention, as defined in the attached claims.

In particular, as will be evident to the person skilled in the art, the shape and the structure of the actuator element 6 can be different. In particular, as illustrated in FIG. 11, the flexible structure 42 may not be provided. In this case, the actuator element 6 is made by pressure areas defined directly on the surface of the membrane 39 of the pressure sensor 9 (for example, highlighted by purposely provided writings or symbols), which are directly accessible to the user through the window 43 in the casing 44 of the mobile phone 1. Alternatively, the actuator element 6 can comprise a single pin-shaped element joystick), which is arranged in a central position with respect to the membrane 39 within the window 43 and is free to move with a number of degrees of freedom (in particular, as many as are the directions of displacement generation within the graphic interface 5).

Furthermore, a different number of sensitive elements 11 can be provided. For example, according to a further embodiment of the present invention, shown in FIG. 12, the sensor 9 comprises an additional sensitive element 11 (for a total of five sensitive elements 11), integrated in the die 10, and arranged at the center of the cross formed by the other sensitive elements 11. Pressure on the further sensitive element 11 can, for example, generate selection operations, or else zooming of an image displayed on the display 2. In this case, the interface electronic circuit 12 is arranged as a frame around said further sensitive element 11. Alternatively, as illustrated even more schematically in FIG. 13, the die 10 can house a total of nine sensitive elements 11 of a microelectromechanical type, arranged in a regular way in an array of three rows and three columns. This configuration of the sensitive elements 11 enables generation of displacements also diagonally within the graphic interface 5. The sensitive element 11 in a central position once again can have the function of performing selections, or zooming of an image, for example. Even in this case, to a greater pressure may correspond a greater execution speed of the corresponding action in the graphic interface 5. As illustrated in FIG. 14, the die 10 can even house just three sensitive elements 11, arranged in a triangle.

In addition, the sensitive elements 11 can each be integrated within a respective die of semiconductor material, possibly with a corresponding interface electronic circuit (corresponding to one of the circuit branches 50 of the interface electronic circuit 12). In this case, the various dies can be included within a single package having a structure similar to that of FIG. 8, with electrical connections provided between the connection pads of the individual dies and the outside of the package.

In addition, the interface electronic circuit 12 can comprise further electronic components (not illustrated), for carrying out further processing operations on the output signals, for example for making a comparison thereof and determining the direction of displacement to be generated within the graphic interface 5.

Finally, the data-input device described herein can advantageously be used in any portable electronic apparatus provided with a display and a graphic interface with which it is necessary to interact, for example in a portable personal computer, a PDA, a game-computer console, etc., or else, in a remote control.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A data-input device, comprising:
a package having a chamber formed therein;
a sensor including a semiconductor material body positioned inside the chamber, said body housing first and second sensitive elements, each having a microelectromechanical pressure sensor configured to detect pressure and to generate a respective electrical control signal corresponding to the detected pressure;
a flexible membrane closing the chamber and delimiting a main surface of the package, the membrane being spaced apart from the sensor; and
an elastomeric material positioned in the chamber between the membrane and the sensor, and configured to transmit actuating pressure, applied to an outer surface of the membrane, from the membrane to the sensor.

2. The device according to claim 1 wherein each of said first and second sensitive elements comprises a cavity formed in said body, a diaphragm formed in a surface portion of said body and suspended above said cavity, and piezoresistive transducer elements integrated in peripheral surface portions of said diaphragm and configured to detect deformations of said diaphragm upon actuation of said actuator element.

3. The device according to claim 1 wherein said flexible membrane forms an actuator element.

4. The device according to claim 1 wherein an actuator element comprising a flexible structure shaped to form keys is arranged on top of said flexible membrane.

5. The device according to claim 1 wherein said body houses further sensitive elements, each of said further sensitive elements configured to detect pressure and to generate a respective electrical control signal corresponding to the detected pressure.

6. The device according to claim 5, wherein said body further houses an interface electronic circuit, electrically connected to each of said sensitive elements and configured to determine a position of the actuating pressure on the membrane on the basis of relative values of the respective electrical control signals.

7. The device according to claim 5 wherein said first and second sensitive elements and further sensitive elements are arranged with respect to one another in a geometrical configuration chosen from among a triangle, a cross, and an array.

8. A data-input device, comprising:
an actuator element; and
a sensor mechanically coupled to said actuator element and including first and second sensitive elements integrated in respective bodies of semiconductor material, each of said first and second sensitive elements including a microelectromechanical pressure sensor configured to detect a respective direction of actuation of said actuator element and to generate electrical control signals;
a package having an open chamber formed therein, the first and second sensitive elements being positioned inside the chamber;
a membrane positioned over an opening of the chamber, the actuator element being coupled to the membrane; and
an elastomeric material positioned inside of the chamber, covering the sensor and acting to transmit pressure exerted on the membrane to the sensor, thereby mechanically coupling the actuator element to the sensor.

9. The device according to claim 8 wherein said sensor also includes further sensitive elements integrated in respective bodies of semiconductor material, each of said further sensitive elements including a microelectromechanical pressure sensor configured to detect a respective direction of actuation of said actuator element, and wherein said first and second sensitive elements and further sensitive elements are arranged with respect to one another in a geometrical configuration chosen from among a triangle, a cross, and an array.

10. An electronic apparatus comprising:
a data-input device having:
a chamber;
an elastomeric material substantially filling the chamber;
an actuator element including a membrane closing the chamber;
a sensor including a body made of semiconductor material positioned in the chamber, the elastomeric material being configured to transfer pressure from the membrane to the body of semiconductor material, said body housing first and second sensitive elements configured to detect respective directions of actuation of the actuator element and to generate respective electrical control signals, each of said first and second sensitive elements including a microelectromechanical pressure sensor.

11. The apparatus according to claim 10, comprising a display controllable by means of said data-input device.

12. The apparatus according to claim 10 wherein the apparatus is one of: a mobile phone, a PDA, a personal computer, a game-computer console, or a remote control.

13. A pressure sensor comprising:
a body of semiconductor material;
a plurality of diaphragms formed over respective cavities in the body;
a circuit formed in the body and configured to detect deflection of each of the plurality of diaphragms and produce a signal corresponding to a degree of deflection of each; and
a package having a chamber within which the body is mounted;
a membrane closing the chamber and forming an upper surface of the package;
an elastomeric material covering the body and substantially filling a space between the membrane and the body such that pressure on a region of the upper surface of the package is transmitted by the elastomeric material to the body and results in selective deflection of one or more of the plurality of diaphragms that lie closest to that region of the upper surface.

14. The pressure sensor of claim 13, comprising a plurality of piezoresistive elements formed in the body adjacent to each of the plurality of diaphragms and configured to be responsive to deflection of the respective diaphragm, the circuit being coupled to the piezoresistive elements such that responses of the piezoresistive elements to deflection of the respective diaphragm are detected by the circuit.

15. The pressure sensor of claim 13 wherein the plurality of diaphragms are arranged with respect to one another in a geometrical configuration chosen from among a triangle, a cross, and an array.

16. A device comprising:
a pressure sensor including a body of semiconductor material and a plurality of diaphragms formed over respective cavities in the body;
deflection means for selectively deflecting individual ones of the plurality of diaphragms; and
a circuit configured to detect deflection of each of the plurality of diaphragms and command operation of one of a plurality of functions of the device in response to a combination of deflections detected.

17. The device of claim 16 wherein the circuit is further configured to detect a degree of deflection of each of the plurality of diaphragms.

18. The device of claim 16 wherein the deflection means comprises a keypad.

19. The device of claim 16 wherein the deflection means comprises a membrane positioned above the body of semiconductor material, and a space between the membrane and the body filled with an elastomeric material.

20. The apparatus according to claim 10 wherein each of the sensitive elements includes a cavity formed in the body of semiconductor material and covered by a diaphragm.

21. The device of claim 1, further comprising a circuit coupled to the sensor and configured to determine a location of the actuating pressure on the membrane by determining, from the respective electrical control signals, which of the first and second sensitive elements has undergone a greater deformation.

22. A data input device, comprising:
a package having a chamber;
a sensor positioned in the chamber and including a semiconductor material body having a plurality of sensitive elements each configured to generate a control signal corresponding to pressure applied to the respective sensitive element, the chamber being substantially filled with an elastomeric material for transmission of pressure from an actuator element to the plurality of sensitive elements;
a circuit coupled to the sensor and configured to determine, from the respective control signals, a direction of movement of the actuator element, on the basis of a relative pressure applied to the respective sensitive elements by the movement of the actuator element, wherein the actuator element includes a membrane positioned over the chamber, and the semiconductor material body is affixed to an inner wall of the chamber, opposite the membrane.

23. The pressure sensor of claim 13 wherein the circuit is configured to determine on which of a plurality of regions on the upper surface of the package the pressure is applied, based on a relative degree of deflection of each the plurality of diaphragms.

24. The device of claim 1 wherein the semiconductor material body is affixed to an inner wall of the chamber, opposite the membrane.

25. The apparatus of claim 10 wherein the body of semiconductor material is affixed to an inner wall of the chamber, opposite the membrane.

26. The pressure sensor of claim 13 wherein the body of semiconductor material is bonded to a bottom internal surface of the chamber.

* * * * *